United States Patent [19]
Butler

[11] 4,388,706
[45] Jun. 14, 1983

[54] MEMORY PROTECTION ARRANGEMENT

[75] Inventor: Clyde R. Butler, Lynchburg, Va.

[73] Assignee: General Electric Company, Lynchburg, Va.

[21] Appl. No.: 211,937

[22] Filed: Dec. 1, 1980

[51] Int. Cl.³ .............................................. G11C 11/34
[52] U.S. Cl. ....................................... 365/226; 307/64;
307/238.3; 365/228; 365/229
[58] Field of Search ................ 365/226, 227, 228, 229, 365/189; 307/238.3, 125, 64, 238.2

[56] References Cited

U.S. PATENT DOCUMENTS 4,122,359 10/1978 Breikss ............................ 365/229 X
4,145,761 3/1979 Gunter et al. ................... 365/226 X Primary Examiner—Robert L. Richardson
Attorney, Agent, or Firm—Cushman, Darby & Cushman

[57] ABSTRACT

A memory protection arrangement particularly suitable for use with battery backed-up CMOS RAMs. The voltage level of power to the CMOS RAMs is referenced to the logic supply to eliminate latch-up and low voltage problems and to relax the tolerances required in power supply circuits. In addition, the master chip enable for all CMOS RAMs is latched rather than providing a separate latch for individual chip enable. Furthermore, the state of the logic supply is latched at the beginning of each memory cycle to prevent disabling of the CMOS RAMs during a cycle. An additional voltage sensor controls the enable of a buffer for each chip enable.

5 Claims, 3 Drawing Figures

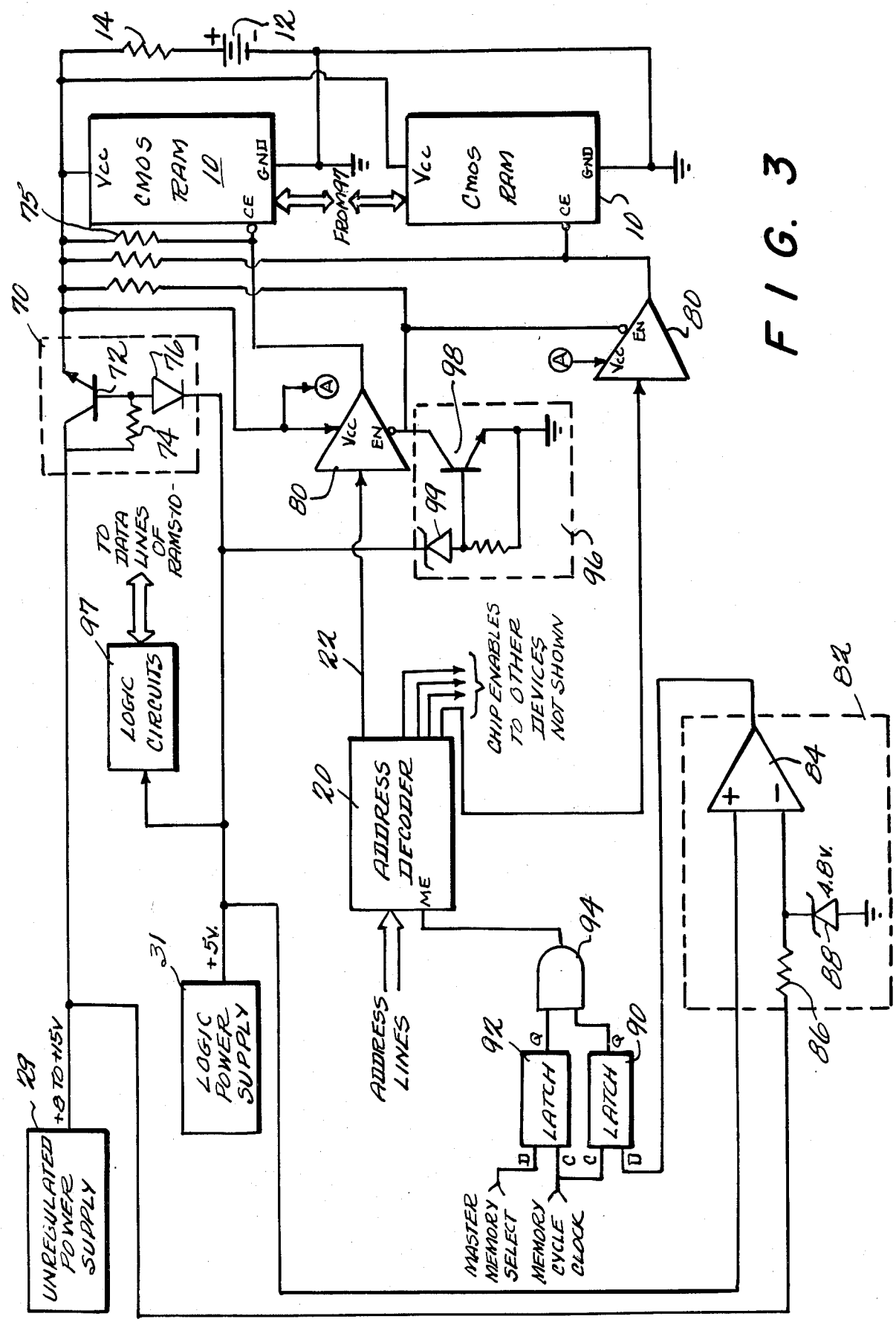

MEMORY PROTECTION ARRANGEMENT

BACKGROUND OF THE INVENTION

This invention relates generally to arrangements for protecting the data integrity of memory devices. More specifically, this invention pertains to a protection arrangement suitable for large arrays of battery backed-up CMOS Random Access Memories (RAMs).

In systems having large arrays of RAMs, the data stored within the RAMs are generally protected from a power-down of the RAM itself by a battery back-up scheme. Such battery back-up schemes maintain power to the RAM even when power to the rest of the system is interrupted.

However, even though power to the RAMs is maintained, a power interruption to the rest of the system can compromise data integrity. Specifically the data integrity of CMOS RAMs, such as in microprocessor systems can be compromised by spurious write and chip select commands applied to a RAM such as a chip enable of short time duration, i.e., an enable signal having a time duration that doesn't meet design standards when power to control circuits is applied and removed. The data integrity of a RAM is also compromised when the voltage at any pin of a CMOS RAM rises above a designated $V_{cc}$ supply voltage due to power supply differentials.

When only one or two CMOS RAMs are used in a microprocessor-based system and the frequency of writing into the RAMS is relatively low, the problem of data integrity being compromised by spurious writes and chip selects can be dealt with easily. A simple voltage comparator is coupled to a chip enable line on each RAM to determine when the supply voltage drops below a predetermined "safe" level. Power for each CMOS RAM is derived from a logic supply using a low voltage drop Schottky diode to minimize voltage drop. Such an arrangement is shown in FIG. 1.

Referring now to FIG. 1, there is shown a typical memory protection circuit for a battery backed-up CMOS RAM. Values shown on FIG. 1 are typical for CMOS technology. For other technologies, the values would have to be altered so as to be consistent with the different voltage and logic levels required.

A CMOS RAM 10 has its $V_{cc}$ supply battery backed-up by a battery 12 and a battery charging resistor 14. $V_{cc}$ power for CMOS RAM 10 is derived from a primary power supply (typically five volts) via a Schottky diode 16 and is coupled to the $V_{cc}$ input of RAM 10. In addition, power from the primary power supply is coupled through Schottky diode 16 and a charging resistor 14 to charge battery 12. A particular RAM 10 is selected by a user control system (not shown) for a write or read operation via an address signal generated on an address bus 18. The address information on bus 18 is decoded by an address decoder 20. The chip enable output 22 of address decoder 20 corresponding to, and thereby specifying, RAM 10 is coupled to one of the RAM's chip enable inputs 32. A second chip enable input 24 of RAM 10 is coupled to the output of a comparator 26.

Comparator circuit 44 including a comparator 26 compares the voltage of the primary supply, coupled to its inverting input, with a threshold voltage established by current flowing from a bulk power supply (not shown) through a resistor 28 and a Zener diode 30. For CMOS technology, Zener diode 30 is typically 4.8 volts. Of course, for other technologies, Zener diode 30 would have a different value.

If the voltage from the primary power supply drops below 4.8 volts, as established by Zener diode 30, then a logic level "high" signal appears at the output of comparator 26 and is coupled to chip enable 24 of RAM 10. This prevents the writing into RAM 10 since all chip enables must be low for writing to take place. Thus, during a power interruption, as soon as the primary power supply voltage drops below 4.8 volts, it becomes impossible to write into RAM 10.

The protection arrangement shown in FIG. 1, however, is not fail safe and has several operational disadvantages. One such disadvantage is that its application is limited to RAMs having two separate and distinct chip enable inputs. Also, the arrangement requires a low voltage drop Schottky diode in the power supply. If the voltage drop across this diode is too great, the CMOS RAM may not operate because its power supply voltage is too low or it may latch up because the voltage on its input pins exceeds the voltage on its $V_{cc}$ supply pin. Another disadvantage with this simple arrangement is that the integrity of the writing operation is not protected if power fails during a write access. During such a power failure, data may or may not be written into RAM 10. Yet another disadvantage with the simple circuit arrangement shown in FIG. 1 is that many CMOS RAM devices 10 do not tolerate a chip enable signal of less than a predetermined duration of time (short chip enable) such as can occur during a power interruption. Also the arrangement requires close tolerances on the supply to the other circuit logic (not shown) and on the $V_{cc}$ supply for RAMs 10.

Referring now to FIG. 2, there is shown a schematic diagram of another known memory protection circuit that is utilized when the simple arrangement of FIG. 1 is inadequate. The FIG. 2 arrangement has been used when larger arrays of RAMs are used, when writing operations occur more frequently or are more likely to occur during a power failure, and when RAMS having only a single chip enable are used.

In this second known arrangement, the address decoded chip enable (CE) to each RAM (only one of which is shown) is latched on each memory cycle and buffered. The latching prevents short chip enables and their attendant possible loss of data. The buffers are disabled after the last processor cycle is completed. Power is typically taken from the logic supply or derived from a zener regulation circuit. Specifically, the address decoded chip enable signal 22 from address decoder 20 is latched by a latch 60 and is then buffered by a three-state buffer 62. A comparator circuit 50, analogous to comparator circuit 44 shown in the FIG. 1 arrangement, includes a comparator 52, Zener diode 54, and resistor 56 for establishing a threshold voltage and accompanying that threshold voltage with that of the primary power supply. Comparator circuit 50 disables RAM 10 when the voltage from the primary power supply drops below 4.8 volts.

In this FIG. 2 arrangement, the latching of the chip enable for each of RAMs 10 prevents a short chip enable signal from being coupled to a RAM and the possible loss of data resulting therefrom. Buffer 62 is disabled after each processor cycle is completed. A time delay element 58 helps to prevent a short time duration chip enable by delaying removal of the enable signal for a given time period until the external circuitry, such as a microprocessor, has been reset (by circuitry not shown). Power for the protection circuit is typically either taken from the logic supply or derived from a simple Zener regulator circuit.

The arrangement shown in FIG. 2 also has operational disadvantages. Using the circuit arrangement of FIG. 2, each RAM 10 (only one shown in the Figure) requires a separate latch 60 and buffer 62. It also rquires close tolerances on the $V_{cc}$ supply to other circuit logic (not shown) and on the Zener diode supply for RAMs 10. Also, there is a danger of disabling the RAM 10 chip enable line during a read or write operation.

SUMMARY OF THE INVENTION

In order to overcome the disadvantages of the prior art arrangements such as those shown in FIGS. 1 and 2, there is provided a CMOS memory protection arrangement for protecting large arrays of battery backed-up CMOS RAMs in microprocessor-based systems from spurious write and chip select signals when power to the circuits controlling the RAMs is interrupted. The memory protection circuit provided by the present invention provides additional protection by preventing the voltage at any pin of a RAM from going above its intended $V_{cc}$ supply voltage due to a voltage differential between the CMOS RAM $V_{cc}$ supply and the power supplied to other circuits.

To eliminate latch up and low voltage problems and to relax component tolerances in both power supply circuits, the $V_{cc}$ power supply voltage for all RAMs is referenced to a logic power supply. Power is supplied to the RAMS 10 from an unregulated power supply 29 having a voltage higher than the five volt logic power supply 31. This unregulated power supply is regulated down to the logic power supply voltage level. Further operation advantage is derived from a novel latching arrangement.

Instead of latching each chip enable, as is done in the arrangement of FIG. 2, only the master chip enable for all RAMs 10 is latched. In addition, the state of the logic supply is latched at the beginning of each memory cycle to prevent disabling of RAMs 10 during the memory cycle. A second voltage sensor is utilized to control the enable signal to chip enable buffers.

A regulator 70 regulates the unregulated power supply down to the five volts for powering RAMs 10. Regulator 70 is referenced to the five volt logic supply through a diode rather than to ground through a Zener diode as in a conventional power supply. This arrangement permits the RAM's power supply to track any variations in logic supply voltage.

The output of the comparator is latched on each memory cycle to prevent short chip enable signals to RAMs 10. A master chip enable (also known in the art as "bank enable") to all CMOS RAMs is latched instead of individual chip enables. This reduces the number of latches required. Chip enable buffers 80 are provided in the enable line to each RAM 10. Buffers 80 are CMOS logic and are powered by the RAM $V_{cc}$ voltage.

A second voltage sensor is used to disable the chip enable buffers. This sensor has a trip voltage set significantly below that of the voltage comparator. This second voltage sensor maintains the three state buffers disabled as the logic supply falls to zero volts.

Thus, there is provided a memory protection arrangement for protecting a plurality of memory elements, accessed by a control system, from the interruption of power from a primary power source intended therefore, the memory element comprising a power input requiring, for normal operation, coupling to a voltage within a predetermined operating range, and at least one chip enable input, comprising:

means for referencing the voltage level of power supplied in the memory elements to the voltage of a logic supply source;

first comparator means for coupling to the logic supply power source, normally providing a first voltage within the predetermined operating range, for (a) determining whenever the voltage of the logic supply source falls below a second voltage within the predetermined operating range and (b) providing a first comparator signal indicative thereof;

an address decoder for (a) receiving an addresses of memory elements to be accessed by the control system and (b) providing decoded individual chip enable signals for coupling to the chip enable of each of said memory elements, the address decoder having a master enable input; and latch means, for receiving the first comparator signal and providing in response thereto a master disable signal, indicative of the voltage of the logic supply power source falling below the second voltage; the master disable signal being coupled to the master enable input of the address decoder, the master disable signal operating to disable all memory elements coupled thereto at the next memory cycle of the control system.

BRIEF DESCRIPTION OF THE DRAWINGS

The invention will become better understood by reference to the following detailed description and the appended claims when read in conjunction with the Figures wherein:

FIG. 3 is a schematic diagram of the memory protection circuit according to the present invention.

DETAILED DESCRIPTION OF THE PREFERRED EMBODIMENT

Figure 1:
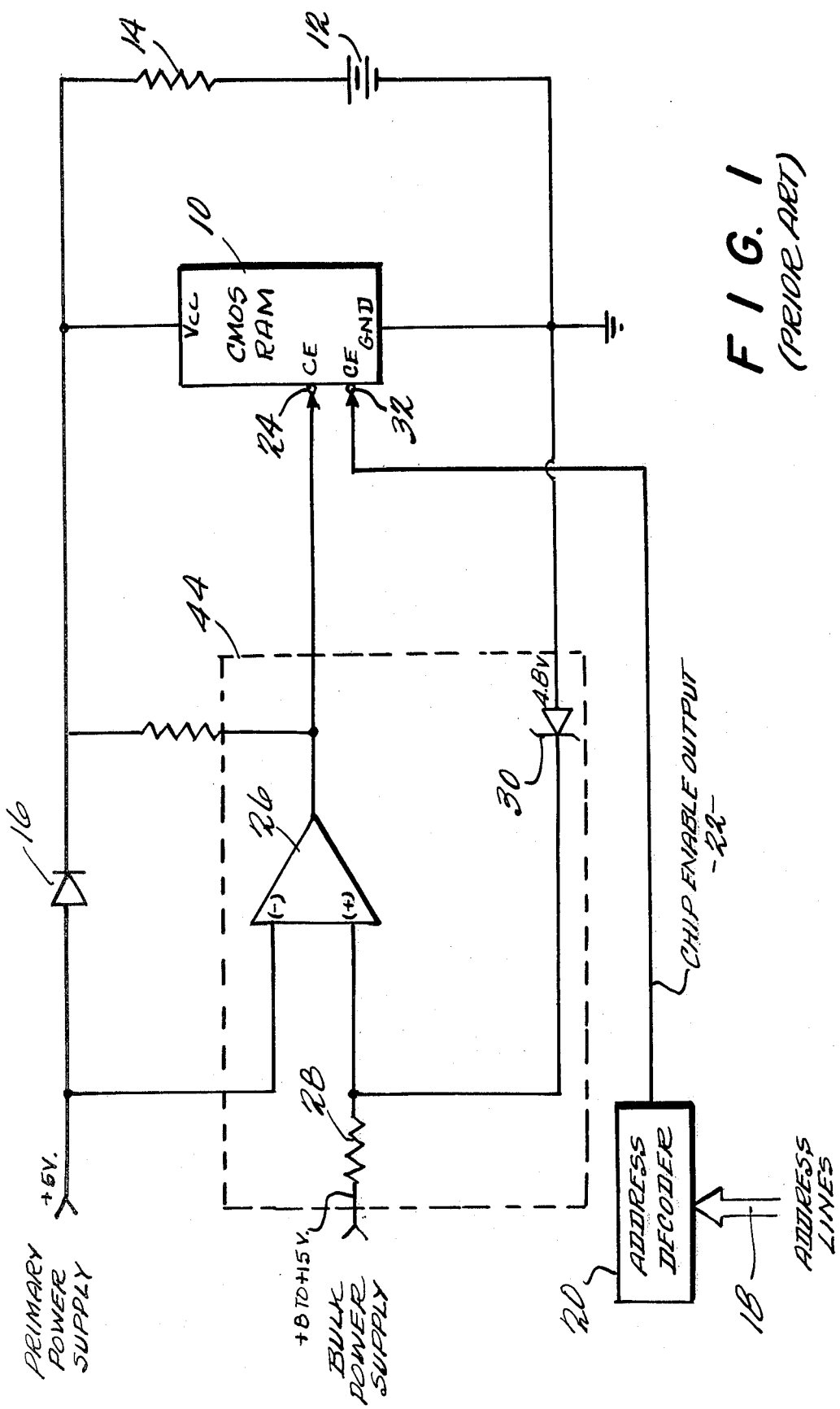
FIG. 1 is a schematic diagram of a prior art CMOS memory protection circuit.

Referring now to FIG. 3, there is shown a detailed schematic diagram of the CMOS memory protection circuit according to the present invention. As in FIGS. 1 and 2 (described in the Background section of this patent), each CMOS RAM 10 (only two of which are shown) is backed-up by a battery 12 which is charged through a charging resistor 14. In addition, the chip enable (CE) input of each RAM 10 is coupled to the $V_{cc}$ supply through a pull-up resistor such as resistors 75. However, in this circuit arrangement $V_{cc}$ power for RAM 10 is supplied from an unregulated power supply 29 having a voltage range of 8 to 15 volts. Power from the unregulated power supply 29 is regulated down to five volts through a regulator 70 which, in essence, replaces Schottky diode 16 shown in FIGS. 1 and 2. Regulator 70 includes a transistor 72, resistor 74, and a diode 76. The cathode of diode 76 is coupled to a five volt logic power supply (not shown).

A voltage comparator circuit 82 including a comparator 84, a resistor 86 and a Zener diode 88 compares the voltage of a logic power supply 31 with a predetermined reference voltage such as 4.8 volts in a 5 volt logic power supply system as established by the current through the resistor and the Zener diode from unregulated power supply 29. The output of comparator circuit 82 is coupled to the "D" input of a latch 90. The "C" input of latch 90 is coupled to a source of memory cycle clock pulses for the microprocessor based system of which RAM 10 is a part. The memory cycle clock source is also coupled to the "C" input of a second latch 92, the "D" input of latch 92 is coupled to a master memory select signal. The Q outputs of latches 90 and 92 are coupled to inputs of an AND gate 94, the output of which is coupled to the master enable (ME) of address decoder 20. The use of the master enable (ME) of address decoder 20 (analogous to address decoders 20 shown in FIGS. 1 and 2) constitutes the essential difference between the basic circuit arrangement of the present invention and that of the prior art arrangement shown in FIGS. 1 and 2. In essence, the present invention latches the master chip enable for all RAMs 10 rather than latching each RAM separately. In addition, the state of logic supply 31 at the beginning of each memory cycle is latched to prevent disabling a RAM 10 during a memory cycle. A second voltage comparator circuit 96 is employed to control the enable to individual chip buffers 80 (two of which are shown, one buffer being associated with each of RAMs 10). Voltage comparator circuit 96 operates to disable the chip enables coupled thereto when it senses a voltage less than a predetermined value such as 4.7 volts in a 5 volt logic power supply system, as determined by a zener diode 99. The output of comparator circuit 82 is latched on each memory cycle to prevent short chip enables from reaching CMOS RAMs 10.

During a time interval during which power is falling, the following sequence of events takes place. As the voltage level of logic power supply 31 drops, the output of comparator 84 changes. At the start of the next memory cycle, the master enable of address decoder 20 is disabled by a gate 94 controlled by latches 90 and 92. As voltage continues to drop, a transistor 98 within circuit 96 cuts off thereby disabling CMOS buffer 80. At some point later in time, as voltage continues to drop, the various logic circuits 97 and comparators go to undefined states. However, RAM 10 is protected.

During power up, after a period of power down, RAM 10 is operating in a battery backed-up condition. AS the voltage of logic power supply 31 begins to climb, logic function returns to the various logic circuits 97 and comparators. At some time later, as voltage continues to rise, transistor 98 turns on, returning the enable function to buffer 80. As voltage continues to climb, comparator 84 enables access via address decoder 20 on the next memory cycle and normal operation again takes place.

Thus, when the voltage of logic power supply 31 has fallen to such a degree that comparator output cannot be guaranteed and consequently chip enables cannot be guaranteed. RAM 10 has already been protected and is operating in a battery back-up mode.

Figure 2:
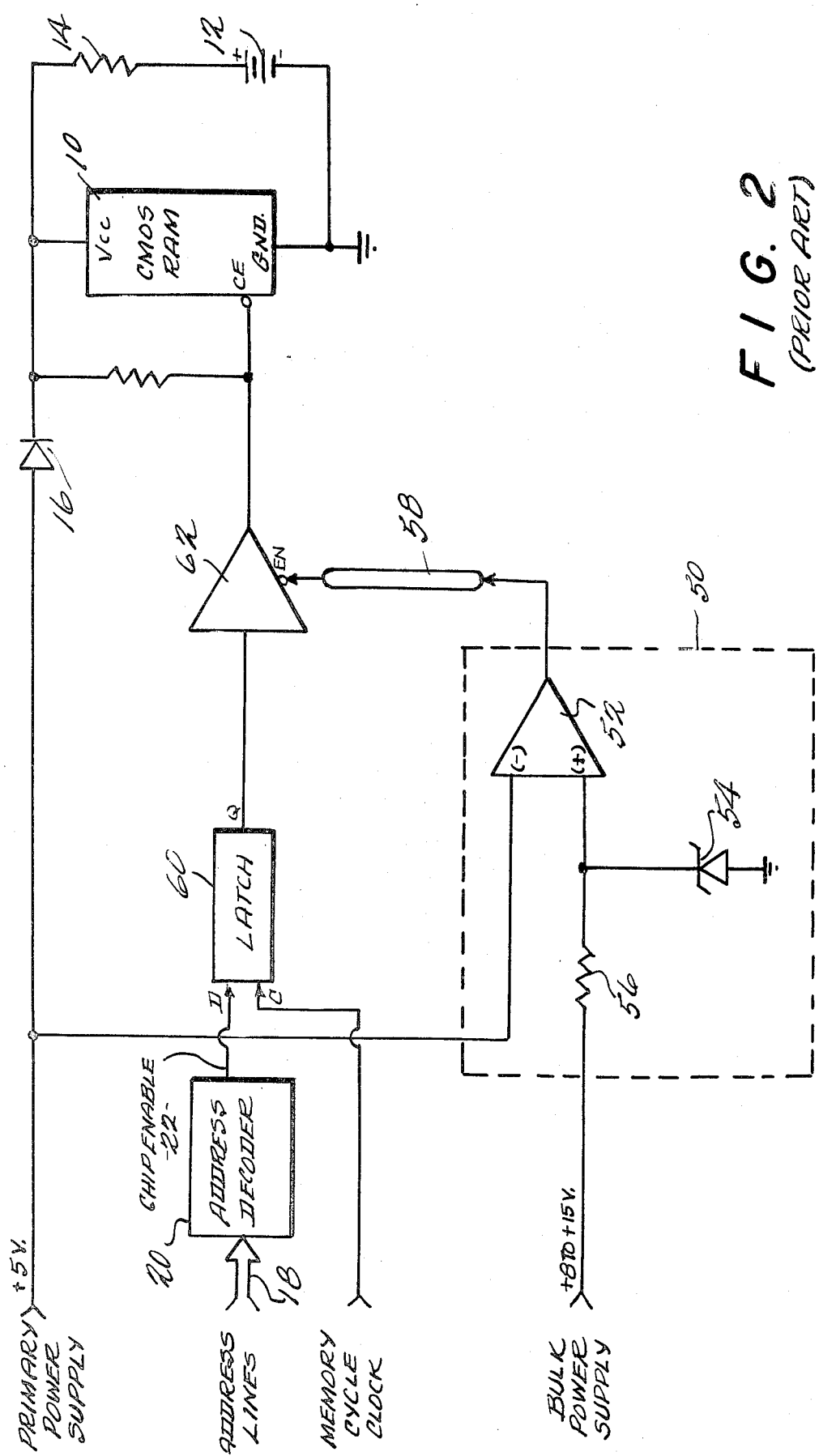
FIG. 2 is a second prior art CMOS memory protection circuit.

Therefore, there has been provided a CMOS memory protection circuit which is useful in protecting large arrays of CMOS RAMs utilized in microprocessor-based systems and overcoming the operational disadvantages associated with the known protection arrangements shown in FIGS. 1 ad 2.

Of course, other embodiments and alternatives will occur to these of ordinary skill in the art having the benefit of the teachings contained herein. Such other and alternative embodiments are therefore intended to be within the scope of the claims.

What is claimed is:

1. An arrangement for protecting a plurality of memory elements, accessed by a control system, from the interruption of power from a primary power source, the memory elements having a power input requiring, for normal operation, connection to a voltage within a predetermined operating range, and at least one chip enable input, comprising:
   means for referencing the voltage level of power from said primary power source to the memory elements to the voltage of a logic supply source;
   first comparator means for coupling to the logic supply power source, normally providing a first voltage within the predetermined operating range, for (a) determining whenever the voltage of the logic supply source falls below a second voltage within the predetermined operating range and (b) providing a first comparator signal indicative thereof;
   an address decoder for (a) receiving addresses of memory elements to be accessed by the control system and (b) providing chip enable signals for coupling to the chip enable of each of said memory elements, the address decoder having a master enable input; and
   latch means, for receiving the first comparator signal and providing in response thereto a master disable signal, indicative of the voltage of the logic supply power source falling below the second voltage; the master disable signal being coupled to the master enable input of the address decoder, the master disable signal operating to disable all memory elements coupled thereto at the next memory cycle of the control system.

2. An arrangement according to claim 1, further comprising:
   second comparator means, coupled to said logic supply power source for determining whenever the voltage thereof falls below a third voltage, less than said first voltage and providing a second comparator signal responsive thereto;
   buffer means coupling a chip enable signal line from the address decoder to a chip enable input of a memory element and having a control input adapted to receive the second comparator signal, the buffer means operable to block an individual chip enable signal from the address decoder to the memory element, said second comparator means and said buffer means providing a backup disable of said memory element for said first comparator means, whereby as the voltage level of said logic supply power source falls during a power interruption, the following sequence of events occurs: the first comparator signal is provided to the latch means, the latch means provides a disable signal to said master enable of the address decoder at the next memory cycle, the buffer means inhibits the flow of any signal from an individual chip enable of said address decoder to a chip enable of said memory element inhibiting access thereto and the memory states ofsaid memory element are maintained by power supplied to the back-up battery.

3. An arrangement according to claim 1 or 2 wherein the means for referencing comprises a voltage regulator coupled to the primary power source and to the logic supply power source for regulating the power from the primary power source by causing the voltage derived therefrom to track the voltage of the logic supply power source so as to provide a regulated voltage within the operating range.

4. A memory protection arrangement, comprising:

plural memory elements, each having a chip enable input;

first latched voltage comparator means for comparing the voltage level of a primary power supply providing power to said memory elements with a predetermined threshold voltage and providing a disable signal to said chip enable inputs to prevent lost data that would otherwise occur as a result of a short chip enable from a power interruption; and second voltage comparator means for sensing the voltage level of an external logic power supply and disabling said memory elements to protect them from spurious signals which may occur during application and removal of power from said primary power supply.

5. In a system having a plurality of memory elements, each having a chip enable input, the improvement comprising:

first comparator means for comparing the voltage level of a primary power supply with a predetermined threshold voltage and producing a disable signal in response to said threshold voltage exceeding said primary power voltage level, a single latch means for synchronizing to a memory cycle said disable signal output of said first comparator, and means for supplying said disable signal to each of said chip enable inputs to prevent the loss of data occurring from a power interruption during a memory access, said means for supplying said disable signal being operative only during the time that a second comparator produces an enabling signal in response to a logic power supply voltage exceeding a predetermined magnitude.

* * * * *